United States Patent
Seymour et al.

(10) Patent No.: US 6,284,619 B1
(45) Date of Patent: Sep. 4, 2001

(54) INTEGRATION SCHEME FOR MULTILEVEL METALLIZATION STRUCTURES

(75) Inventors: Scott A. Seymour, New Milford; Kenneth J. Stein, Sandy Hook, both of CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/607,136

(22) Filed: Jun. 29, 2000

(51) Int. Cl.[7] ..................................................... H01L 21/20
(52) U.S. Cl. ............................................. 438/396; 257/532
(58) Field of Search ..................................... 257/306–308, 257/532–535; 438/396, 397–399, 393–395

(56) References Cited

U.S. PATENT DOCUMENTS

| | | |
|---|---|---|
| 5,208,726 | 5/1993 | Apel . |
| 5,583,359 * | 12/1996 | Ng et al. .............................. 257/306 |
| 6,027,966 | 2/2000 | Saenger et al. . |
| 6,037,664 | 3/2000 | Zhao et al. . |
| 6,054,380 | 4/2000 | Naik . |

* cited by examiner

Primary Examiner—Charles Bowers
Assistant Examiner—Craig Thompson
(74) Attorney, Agent, or Firm—Ratner & Prestia; Tiffany L. Townsend, Esq.

(57) ABSTRACT

A process for forming multilevel metallization structures that improve semiconductor reliability. Multilevel metallization structures are formed through a two-step etch process which alleviates the problem of conductive etch residue forming between metal layers in multilevel structures. The resulting metallization structure has sidewall insulators on selected layers that prevent conductive etch residue from forming between the metal layers. The integration scheme of the present invention is especially applicable to metal-insulator-metal (MIM) capacitors.

20 Claims, 4 Drawing Sheets

INTEGRATION SCHEME FOR MULTILEVEL METALLIZATION STRUCTURES

TECHNICAL FIELD

The present invention relates generally to a process for forming multilevel metallization structures and, more particularly, to an integration scheme for metal-insulator-metal (MIM) capacitors that are not compromised by conductive etch residue.

BACKGROUND OF THE INVENTION

The approach used to manufacture integrated circuits (ICs) on monolithic pieces of silicon substrate involves the fabrication of successive layers of insulating, conducting, and semiconducting materials. Each layer is patterned to form a structure that performs a specific function, usually linked with surrounding areas and subsequent layers. Therefore, the fabrication steps used to manufacture an IC must be executed in a specific sequence, which constitutes an IC process.

It is now the practice to fabricate multiple levels of conductive (typically metal) layers above a substrate. The multiple metallization layers accommodate higher densities as device dimensions shrink well below one micron design rules. Likewise, the size of interconnect structures will also need to shrink, in order to accommodate the smaller dimensions. Thus, as IC technology advances into the range below 0.25 microns, more advanced interconnect architecture is required.

One such architecture is a dual damascene integration scheme in which a dual damascene structure is used. The dual damascene process offers an advantage in process simplification by reducing the process steps required to form the vias and trenches for a given metallization level. The openings for the wiring of a metallization level and the underlying via connecting the wiring to a lower metallization level are formed at the same time. The procedure provides an advantage in lithography and allows for improved critical dimension control. Subsequently, both the via and the trench can be filled using the same metal-filling step, thereby reducing the number of processing steps required. The simplicity of the dual damascene process permits newer materials to replace cost-effectively the use of the existing aluminum-silicon dioxide scheme.

One such newer material is copper. The use of copper metallization improves performance and reliability over aluminum. Copper introduces additional problems, however, which are difficult to overcome when using known techniques for aluminum. For example, in conventional aluminum interconnect structures, a barrier layer is usually not required between the aluminum metal line and a silicon dioxide inter-level dielectric (ILD). When copper is used, copper must be encapsulated from the surrounding ILD, because copper diffuses or drifts easily into the adjoining dielectric. Once the copper reaches the silicon substrate, it will significantly degrade the performance of the device.

In the production of ICs upon semiconductor wafers or chips, the back end of production involves connecting all the fabricated semiconductor devices on the chip with electrically conductive materials. This back-end-of-line (BEOL) "wiring" step, which is the electrical connection scheme for connecting semiconductor devices, completes the circuits as designed to function within the total integrated circuit device. Metal lines are used in the metallization process as electrical connections between semiconductor devices.

In the fabrication of semiconductor devices, BEOL wiring often determines the function of the device. Therefore, BEOL processes are critical in semiconductor manufacturing. BEOL processes complete semiconductor fabrication in the final manufacturing steps. Errors due to faulty BEOL processes forfeit the entire production investment in the nearly completed device. As a result, device failure due to BEOL errors are very costly, and manufacturers strive to avoid BEOL defects.

A common BEOL process involves forming metal-insulator-metal (MIM) capacitors. Typically, these metallization structures are formed as diagrammed in FIGS. 1, 2, and 3. A multilevel structure is formed, as shown in FIG. 1, with a bottom metal layer 10, an interlayer dielectric 12, and a top metal layer 14 deposited sequentially on top of a substrate 8. Interlayer dielectric 12 is preferably an oxide and, more preferably, silicon dioxide. A photoresist pattern 16 is formed on the surface of the top metal layer as illustrated in FIG. 2.

Bottom metal layer 10, interlayer dielectric 12, and top metal layer 14 are simultaneously etched, as illustrated in FIG. 3, according to photoresist pattern 16 in a single etch step along direction arrow 17. An etch residue 18, which can poison the capacitor and render the capacitor useless, may form on interlayer dielectric 12 when bottom metal layer 10, interlayer dielectric 12, and top metal layer 14 (i.e., all three layers) are etched in a single etch step. Etch residue 18 on interlayer dielectric 12 offers an alternate electrically conductive path that can short the capacitor. Because the charge has an alternate path along the sidewall residue, the capacitor cannot function.

To overcome the shortcomings of conventional processes for forming multilevel metallization structures, a new integration scheme for MIM capacitors, is provided. An object of the present invention is to integrate a MIM capacitor into the dual damascene copper BEOL process without impacting wiring and via yield and parametrics. Other objects are to provide a process that yields reliable products while minimizing process cost and manufacturing steps. A related object is to provide a process that substantially eliminates the etch residue problem while forming a beneficial spacer (which contains contaminants and prevents the contaminants from breaking down the capacitor) around the bottom conductive plate. Still another related object is to provide a process that uses conventional semiconductor tooling.

It is still another object of the present invention to achieve a MIM structure for which the dielectric is scaleable in thickness, can be reworked (easily stripped and redeposited) without impacting wiring yield parameters, and can be one of several alternative materials. An additional object is to provide a modular process, i.e., a process having an set of steps independent of prior or subsequent processing steps. Yet another object of this invention is to provide a process that yields a planar or substantially planar capacitor structure, to avoid dielectric thinning over topography, and permits design of the capacitor structure in parallel or serial layouts.

SUMMARY OF THE INVENTION

To achieve these and other objects, and in view of its purposes, the present invention provides a process that avoids the problems of conventional capacitors including a dielectric insulator along the etched surfaces of metal-insulator-metal (MIM) capacitors. By forming the first metal layer independently from the insulator and second metal layers, the present invention uses sidewall spacers of insulator formed during conformal deposition. Conformal deposition of the insulator layer after the first conductive layer has been patterned provides dielectric along the conductive sidewalls to insulate the first metal layer from forming conductive etch residue to the second metal layer.

The disadvantages associated with the prior art processes of fabricating multilevel metallization and interconnect structures are overcome using the present invention. The present invention encompasses a process for forming a patterned structure comprising first and second stacked conductive layer areas where the stacked conductive layer areas are separated by an insulating layer area. Thus, this invention comprises forming, in a first etching step, the first conductive area having a first perimeter, and forming in a single second etching step the insulating layer and the second conductive layer areas. The insulating layer and the second conductive layer areas extend beyond the first perimeter, so that no etch residue can form between the first and second conductive layer areas.

The present invention also encompasses a MIM capacitor structure comprising first and second stacked conductive layer areas separated by an insulating layer area. The first conductive area has a first perimeter, and the insulating layer and second conductive layer areas both extend beyond the first perimeter.

It is to be understood that both the foregoing general description and the following detailed description are exemplary, but are not restrictive, of the invention.

DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
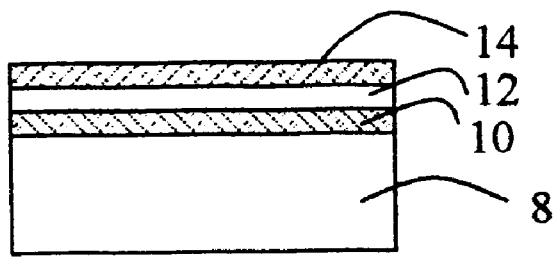
FIG. 1 is a schematic cross-sectional view of a metallization structure of the prior art.
Figure 2:
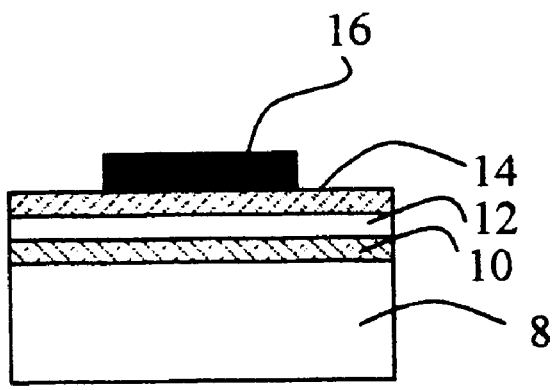
FIG. 2 is a schematic cross-sectional view of the metallization structure of the prior art shown in FIG. 1 with a photoresist pattern.
Figure 3:
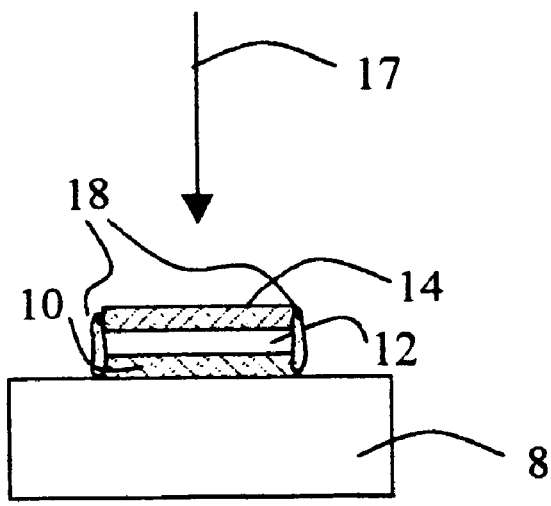
FIG. 3 is a schematic cross-sectional view of the metallization structure of the prior art shown in FIG. 2 after etching.
Figure 4:
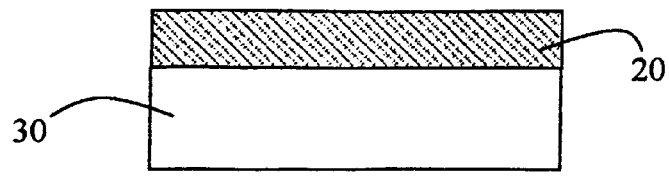
FIG. 4 is a schematic cross-sectional view showing a first metal layer on a substrate in accordance with the present invention.

Referring now to the drawing, wherein like reference numbers refer to like elements throughout, FIG. 4 shows a substrate 30 as a supporting layer, which may be a silicon wafer with a dielectric etch-stop layer (not shown) deposited on the wafer, and a first conductive layer 20 on substrate 30. First conductive layer 20 may be aluminum, nickel, cobalt, silver, gold, palladium, platinum, rhodium, or copper; combinations or alloys of those elements; or any other conductive layer capable of electron transport. The most preferred metal is aluminum and alloys of aluminum. The first conductive layer is deposited to a thickness of 100 to 10,000 Å by physical vapor deposition (PVD), chemical vapor deposition (CVD), or by any technique known in the art.

Although not shown, semiconductor substrate 30 is intended to include numerous active electronic devices and passive electronic components. The particular design of the underlying integrated circuit has not been shown in order to more clearly describe and show the aspects of the present invention. In addition, because the present invention uses back-end-of-line (BEOL) processing techniques and complies with very-large-scale-integration (VLSI) design patterning rules, the devices of the present invention may be fabricated above or between other metallization levels. Thus, semiconductor substrate 30 may include additional metallization and wiring levels within itself.

Figure 5:
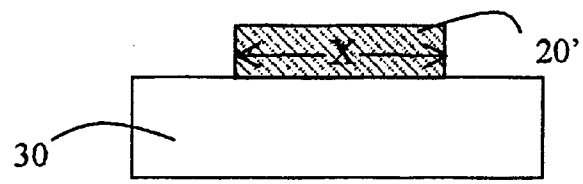
FIG. 5 is a schematic cross-sectional view showing a pattern etched into the structure of FIG. 4.

FIG. 5 is a schematic of the first conductive layer 20' after having been patterned according to a first photoresist mask. The photoresist mask may be patterned by photolithography or any other technique known in the art. "Photolithography" is a process in which a light source illuminates a circuit pattern and projects the image through a lens assembly onto a semiconductor wafer or substrate. Ultimately, the circuit pattern is etched into the wafer.

First conductive layer 20 is etched according to the photoresist pattern. In a preferred embodiment, an etch-stop layer (not shown) of silicon nitride exists between substrate 30 and first conductive layer 20, which is aluminum. First conductive layer 20 can be etched by any dry or wet etching process, or combinations of such processes, and the etch chemistry is selected according to the composition of first conductive layer 20. After the first etch, the photoresist is removed to reveal the structure represented in FIG. 5.

Figure 6:
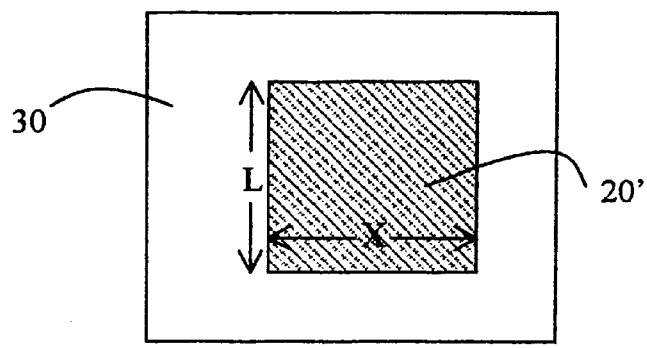
FIG. 6 is a schematic top view showing the structure of FIG. 5.

This first etch step forms a first conductive layer area defined by two dimensions: the width "X" shown in FIGS. 5 and 6, and the length "L" shown in FIG. 6. FIG. 6 is the schematic top view of the structure shown in FIG. 5. The X and L dimensions define the first conductive area and the perimeter of the first conductive area (2L+2X). Although the conductive layer areas are shown as rectangular shapes in the figures, the conductive and insulating layer areas may be any shape including, but not limited to, square, rectangular, triangular, cylindrical, or circular.

Figure 7:
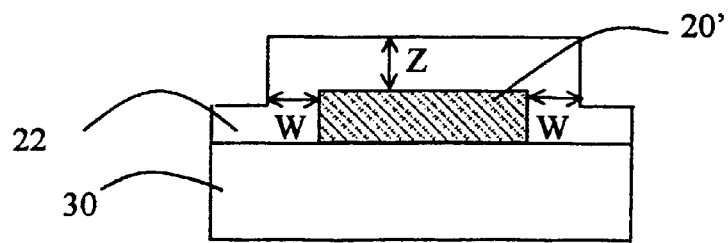
FIG. 7 is a schematic cross-sectional view showing the structure of FIG. 5 with a conformal insulator layer.

Referring next to FIG. 7, a dielectric insulator 22 is deposited conformally over first conductive layer 20'. Dielectric insulator 22 is a continuous layer fully covering first conductive layer 20'. Dielectric insulator 22 may be silicon oxide, barium-strontium titanate, aluminum oxide, tantalum pentoxide, or other dielectric materials suitable for MIM functionality, including organic polymers. The capacitor dielectric may range in thickness from 20 to 8,000 Å, as appropriate for the dielectric constant and deposition process. The deposition may be done by physical vapor deposition (PVD), chemical vapor deposition (CVD), a spin-on process, or a combination of these techniques.

The conformal deposition of the dielectric material over first conductive layer area 20' forms dielectric insulator 22. Dielectric insulator 22 has a thickness "Z" along the top surface of the first conductive area, and a thickness "W"

along the sidewall of the first conductive area. The ideal W:Z ratio is 1. In practice, however, ratios may vary from 0 to 1.

Figure 7A:
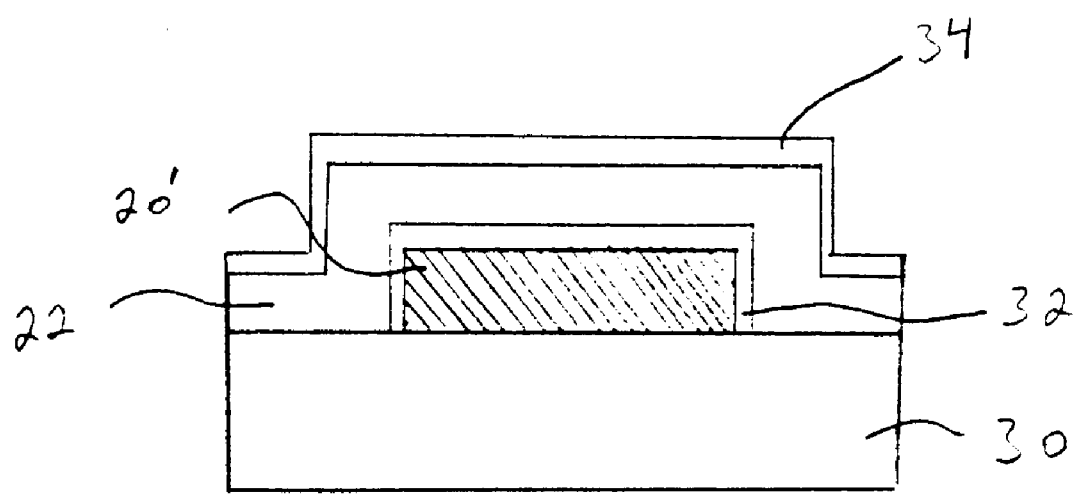
FIG. 7A is a schematic cross-sectional view showing the structure of FIG. 7 with optional barrier layers.

As shown in FIG. 7A, a first barrier layer 32 may be deposited over first conductive layer 20' before dielectric insulator 22 is deposited and a second barrier layer 34 may be deposited after the deposition of dielectric insulator 22. First barrier layer 32 second barrier layer 34 prevent diffusion of material from first conductive layer 20' and from a second conductive layer 24 (see FIG. 8) into dielectric insulator 22. First barrier layer 32 and second barrier layer 34 are typically tantalum, titanium, tungsten, tantalum nitride, titanium nitride, tungsten nitride, silicon nitride, other refractory metals, or combinations of such materials. A preferred barrier layer material is titanium nitride, TiN. First barrier layer 32 and second barrier layer 34 may be applied as PVD or CVD layers having a thickness of between about 50 and about 1,000 Å. Barrier layers of this type are known in the art and their deposition techniques are also well known. First barrier layer 32 and second barrier layer 34 are also conformally deposited, and the W and Z dimensions of dielectric insulator 22 include each barrier layer.

Figure 8:
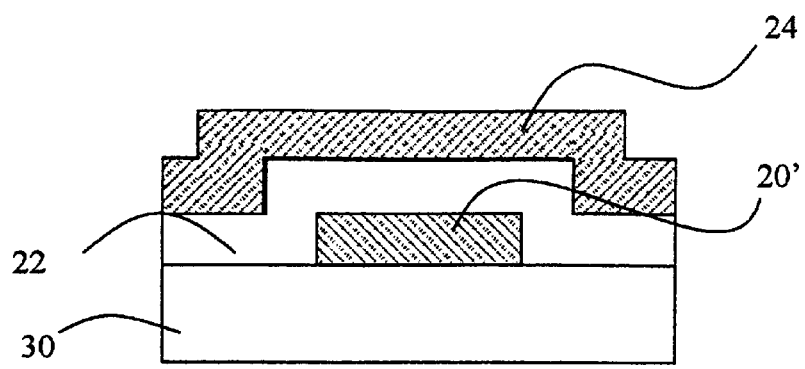
FIG. 8 is a schematic cross-sectional view showing the structure of FIG. 7 with a second conformal metal layer on the insulator layer.

Next, referring to FIG. 8, the second conductive layer 24 is conformally deposited over dielectric insulator 22. Second conductive layer 24 is also deposited by PVD, CVD, or by any technique known in the art to a thickness of 100 to 5,000 Å. Second conductive layer 24 may consist entirely of a barrier metal layer, the same material as first conductive layer 20, any conductive material, or a combination of barrier layer and another conductive layer.

Figure 9:
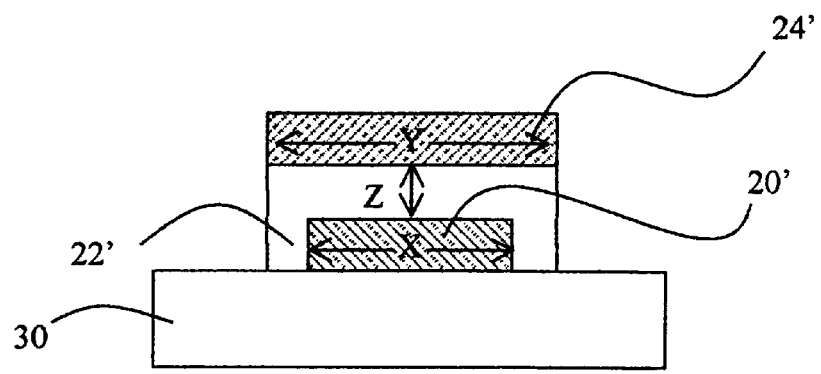
FIG. 9 is a schematic cross-sectional view showing a pattern etched into the structure of FIG. 8.
Figure 10:
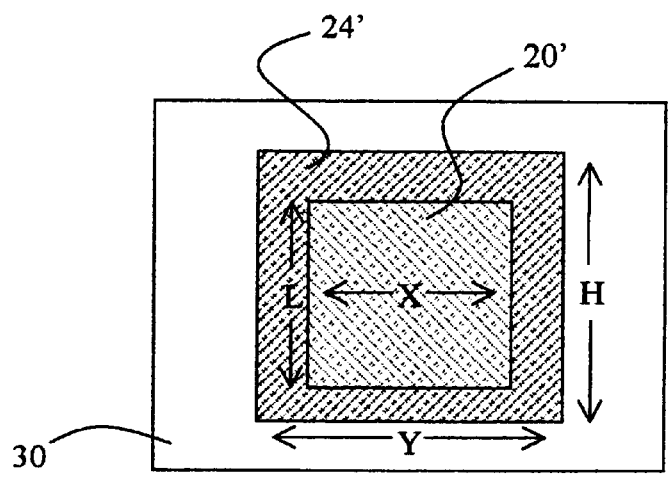
FIG. 10 is a schematic top view showing the structure of FIG. 9.

A second photoresist pattern is exposed and developed on second conductive layer 24. Second conductive layer 24 and dielectric insulator 22 are then etched according to the second pattern. The second pattern prescribes a structure analogous to the first pattern. The dimensions of each feature in the second pattern are such, however, that the areas of second conductive layer 24 and dielectric insulator 22 are larger than the area of first conductive layer 20'. As shown in FIGS. 9 and 10, the resulting second conductive layer 24' and dielectric insulator 22' extend beyond the perimeter of first conductive layer 20'. FIG. 9 is a schematic cross-sectional view showing the MIM structure and FIG. 10 is a schematic top-view of the same structure. The area of first conductive layer 20' with dimensions X and L is shown along with the area of second conductive layer 24' with dimensions Y and H.

The width and length dimensions, Y and H respectively, define the area and the perimeter of both second conductive layer 24' and dielectric insulator 22'. The second etch process of the present invention is designed such that the sidewall thickness W of dielectric insulator 22' prevents the formation of conductive etch residue between first conductive layer 20' and second conductive layer 24'. Accordingly, the dimension Y of second conductive layer 24' satisfies the relationship X<Y, and preferably satisfies the relationship X<Y<X+2W. The dimension H satisfies the relationship L<H, and preferably satisfies the relationship L<Y<L+2W. The dimensions of second conductive layer 24' extend beyond the dimensions of first conductive layer 20' by 50 to 8,000 Å, depending on the thickness of dielectric insulator 22 and the conformality of the layer. When barrier layers exist between the conductive layers and the insulator layer, the thickness of the barrier layers are included in the thicknesses Z and W.

The restrictions on X and Y provide that there always exists an insulator layer along the sidewalls of first conductive layer 20'. The insulated sidewalls prevent any conductive etch residue, which contacts second conductive layer 24', from contacting first conductive layer 20'. This improves the durability and reliability of the metallization structure.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process for forming on a substrate a patterned structure having a first conductive layer, a second conductive layer, and an insulator layer between the first and second conductive layers, the process comprising:

forming in a first etching step the first conductive layer having a first perimeter; and forming in a single, separate, second etching step the insulator layer and the second conductive layer, the insulator layer and the second conductive layer extending beyond the first perimeter of the first conductive layer.

2. The process of claim 1 wherein the patterned structure is a metal-insulator-metal capacitor.

3. The process of claim 1 wherein the insulator layer overlies and encompasses the first conductive layer.

4. The process of claim 1 wherein a first barrier layer is deposited between the first conductive layer and the insulator layer and wherein a second barrier layer is deposited between the second conductive layer and the insulator layer.

5. The process of claim 4 wherein at least one of the first and second barrier layers is selected from the group consisting of tantalum, titanium, tungsten, tantalum nitride, titanium nitride, tungsten nitride, silicon nitride, and tungsten silicon nitride.

6. The process of claim 1 wherein the substrate is a silicon oxide wafer.

7. The process of claim 1 wherein the substrate comprises an etch-stop layer.

8. The process of claim 1 wherein the first conductive layer and the second conductive layer are metals selected from the group consisting of aluminum, nickel, cobalt, silver, gold, palladium, platinum, rhodium, copper, alloys and combinations of such metals.

9. The process of claim 8 wherein the first and second conductive layers are aluminum and alloys of aluminum.

10. The process of claim 1 wherein the first and second conductive layers are defined by photolithography.

11. The process of claim 1 wherein the insulator layer comprises silicon oxide.

12. A metal-insulator-metal stacked capacitor structure comprising:

a substrate;

a first conductive layer being disposed on the substrate and having a first perimeter;

a second conductive layer; and an insulator layer being disposed between and separating the first and second conductive layers, the insulator layer and the second conductive layer being substantially co-extensive and both extending beyond the first perimeter of the first conductive layer.

13. The structure according to claim 12 further comprising a first barrier layer between the insulator layer and the first conductive layer and a second barrier layer between the insulator layer and the second conductive layer.

14. The structure according to claim 13 wherein the barrier layers are selected from the group consisting of tantalum, titanium, tungsten, tantalum nitride, nitride, tungsten nitride, silicon nitride, tungsten silicon nitride, and combinations thereof.

15. The structure according to claim 12 wherein the substrate is a silicon oxide wafer.

16. The structure according to claim 12 wherein the substrate includes an etch-stop layer.

17. The structure according to claim 12 wherein the first conductive layer and the second conductive layer are aluminum, nickel, cobalt, silver, gold, palladium, platinum, rhodium, copper, or alloys or combinations of such metals.

18. The structure according to claim 17 wherein the first conductive layer and the second conductive layer are aluminum or alloys of aluminum.

19. The structure according to claim 12 wherein the first and second conductive layers are defined by photolithography.

20. The structure according to claim 12 wherein the insulator layer comprises silicon oxide.

* * * * *

UNITED STATES PATENT AND TRADEMARK OFFICE
CERTIFICATE OF CORRECTION

PATENT NO.   : 6,284,619 B1
DATED        : September 4, 2001
INVENTOR(S)  : Scott A. Seymour and Kenneth J. Stein It is certified that error appears in the above-identified patent and that said Letters Patent is hereby corrected as shown below:

Column 7,
Line 1, insert -- titanium -- between the comma and "nitride"

Signed and Sealed this

Twenty-fourth Day of September, 2002

Attest:

Attesting Officer

JAMES E. ROGAN
Director of the United States Patent and Trademark Office